(12) United States Patent
Goshonoo et al.

(10) Patent No.: US 7,947,521 B2
(45) Date of Patent: May 24, 2011

(54) METHOD FOR FORMING ELECTRODE FOR GROUP-III NITRIDE COMPOUND SEMICONDUCTOR LIGHT-EMITTING DEVICES

(75) Inventors: Koichi Goshonoo, Aichi-ken (JP); Miki Moriyama, Aichi-ken (JP)

(73) Assignee: Toyota Gosei Co., Ltd., Nishikasugai-gun, Aichi-ken (JP)

( * ) Notice: Subject to any disclaimer, the term of this patent is extended or adjusted under 35 U.S.C. 154(b) by 509 days.

(21) Appl. No.: 12/078,066

(22) Filed: Mar. 26, 2008

(65) Prior Publication Data
US 2008/0293231 A1 Nov. 27, 2008

(30) Foreign Application Priority Data
Mar. 27, 2007 (JP) ................. 2007-082810

(51) Int. Cl.
*H01L 21/00* (2006.01)
(52) U.S. Cl. .......... 438/46; 438/573; 438/584; 438/605; 257/E21.158; 257/E21.172; 257/E33.062
(58) Field of Classification Search .............. 438/22, 438/39, 46, 47, 605, 570–583, 584, 597; 257/99, E21.158, E21.161, E21.172, E33.062, 257/E33.063
See application file for complete search history.

(56) References Cited

U.S. PATENT DOCUMENTS

| | | | | |
|---|---|---|---|---|
| 6,130,446 A | * | 10/2000 | Takeuchi et al. | 257/99 |
| 6,414,339 B1 | * | 7/2002 | Tsutsui | 257/99 |
| 6,577,006 B1 | * | 6/2003 | Oota et al. | 257/745 |
| 6,887,311 B2 | * | 5/2005 | Fudeta et al. | 117/3 |
| 7,253,450 B2 | * | 8/2007 | Senda et al. | 257/100 |
| 7,582,912 B2 | * | 9/2009 | Yoo | 257/94 |
| 2003/0104705 A1 | | 6/2003 | Fudeta et al. | |
| 2003/0189212 A1 | * | 10/2003 | Yoo | 257/79 |
| 2005/0145875 A1 | * | 7/2005 | Kim et al. | 257/103 |
| 2007/0023775 A1 | * | 2/2007 | Jang | 257/99 |
| 2008/0042159 A1 | * | 2/2008 | Eitoh et al. | 257/103 |
| 2008/0061308 A1 | * | 3/2008 | Yoon | 257/94 |

FOREIGN PATENT DOCUMENTS

| | | |
|---|---|---|
| CN | 1416155 A | 5/2003 |
| CN | 1905225 A | 1/2007 |
| JP | 2003-86843 | 3/2003 |
| JP | 2004-140052 | 5/2004 |
| JP | 2004-179347 | 6/2004 |
| JP | 2005-11857 | 1/2005 |

OTHER PUBLICATIONS

Chinese Office Action dated May 8, 2009, with English translation.

* cited by examiner

*Primary Examiner* — Michael S Lebentritt
*Assistant Examiner* — Daniel Whalen
(74) *Attorney, Agent, or Firm* — McGinn IP Law Group, PLLC

(57) ABSTRACT

A method for forming an electrode for Group-III nitride compound semiconductor light-emitting devices includes a step of forming a first electrode layer having an average thickness of less than 1 nm on a Group-III nitride compound semiconductor layer, the first electrode layer being made of a material having high adhesion to the Group-III nitride compound semiconductor layer or low contact resistance with the Group-III nitride compound semiconductor layer and also includes a step of forming a second electrode layer made of a highly reflective metal material on the first electrode layer.

8 Claims, 8 Drawing Sheets

METHOD FOR FORMING ELECTRODE FOR GROUP-III NITRIDE COMPOUND SEMICONDUCTOR LIGHT-EMITTING DEVICES

BACKGROUND OF THE INVENTION

1. Field of the Invention

The present invention relates to a method for forming an electrode for Group-III nitride compound semiconductor light-emitting devices. The term "Group-III nitride compound semiconductor" used herein covers n- and p-type compound semiconductors doped with any element; compound semiconductors containing a Group-III or —V element and at least one selected from the group consisting of B, Ti, P, As, Sb, and Bi; and compound semiconductors represented by the formula $Al_xGa_yIn_{1-x-y}N$, wherein x, y, and x+y are zero to one.

2. Description of the Related Art

Conventional group-III nitride compound semiconductor light-emitting devices have low light extraction efficiency. The following documents disclose various techniques for forming electrodes from metals having high visible light reflectivity: Japanese Unexamined Patent Application Publication Nos. 2003-086843, 2004-179347, 2005-011857, and 2004-140052.

A conventional Group-III nitride compound semiconductor light-emitting device (light-emitting diode) of a face up-type will now be described. FIG. 8 is a sectional view of the Group-III nitride compound semiconductor light-emitting device, which is represented by reference numeral 900. The Group-III nitride compound semiconductor light-emitting device 900 includes a sapphire substrate 10, a buffer layer (not shown) made of aluminum nitride (AlN), an n-type GaN layer 11 doped with Si, an n-type AlGaN clad layer 12 doped with Si, a light-emitting layer 13 having a GaN/InGaN multi-quantum well structure, a p-type AlGaN clad layer 14 doped with Mg, a p-type GaN layer 15 doped with Mg, and a $p^+$-type GaN layer 16, these layers being deposited on the sapphire substrate 10 by metal-organic chemical vapor deposition (MOCVD) or metal-organic physical vapor deposition (MOPVD) in that order.

The $p^+$-type GaN layer 16 is substantially covered with a translucent electrode 21 made of indium tin oxide (ITO). The translucent electrode 21 is partly covered with a pad electrode 22 made of gold. An n-electrode 90 including a vanadium (V) layer 91 and an aluminum (Al) layer 92 is disposed on the n-type GaN layer 11. Light is extracted through the translucent electrode 21; hence, the Group-III nitride compound semiconductor light-emitting device 900 is a face up-type light-emitting diode (LED).

N-electrodes are usually made of aluminum, which is inexpensive. Aluminum has high reflectivity for near-ultraviolet to visible light and is suitable for electrodes for light-emitting devices. However, the bonding strength between aluminum and gallium nitride or the like is not necessarily high; hence, an aluminum electrode should not be directly formed on a GaN layer but needs to be formed on a contact electrode layer which is made of another metal and which is disposed on the GaN layer.

With reference to FIG. 8, the vanadium layer 91 has a thickness of about 20 nm (200 Å). Investigations performed by the present inventors have shown that the presence of the vanadium layer 91, which has a thickness of about 20 nm (200 Å), allows the reflectivity of the interface between the n-electrode 90 and the n-type GaN layer 11 to be about 40%, that is, the presence of the vanadium layer 91 causes serious light absorption. In usual, an n-electrode occupies about 10% of the area of a horizontal surface of a light-emitting device. This n-electrode occupies such a large area and has an absorptance of about 60%; hence, the influence of this n-electrode on the light extraction efficiency of the light-emitting device is non-negligible.

SUMMARY OF THE INVENTION

The present invention has been made to solve the above problem. It is an object of the present invention to provide a method for forming an electrode which has high reflectivity and which is securely bondable to a gallium nitride layer.

According to a preferred embodiment of the present invention, a method for forming an electrode for Group-III nitride compound semiconductor light-emitting devices includes a step of forming a first electrode layer having an average thickness of less than 1 nm on a Group-III nitride compound semiconductor layer, the first electrode layer being made of a material having high adhesion to the Group-III nitride compound semiconductor layer or low contact resistance with the Group-III nitride compound semiconductor layer, and also includes a step of forming a second electrode layer made of a highly reflective metal material on the first electrode layer.

In the method, the first electrode layer is preferably formed at a rate of 0.2 nm/s or less.

In the method, the material for forming the first electrode layer is preferably at least one selected from the group consisting of metals such as titanium (Ti), vanadium (V), chromium (Cr), nickel (Ni), indium (In), cobalt (Co), copper (Cu), tungsten (W), tantalum (Ta), niobium (Nb), tin (Sn), hafnium (Hf), zirconium (Zr), manganese (Mn), and magnesium (Mg); alloys of at least two of the metals; alloys principally containing at least one of the metals; nitrides of the metals; and carbides of the metals.

In the method, the highly reflective metal material is preferably at least one selected from the group consisting of metals such as silver (Ag), aluminum (Al), rhodium (Rh), and platinum (Pt); alloys of at least two of the metals; and alloys principally containing at least one of the metals and the second electrode layer preferably has a thickness of 0.03 to 5 µm.

In the method, the electrode is preferably an n-electrode and the Group-III nitride compound semiconductor layer is preferably of a negative type.

In general, the bonding strength between a Group-III nitride compound semiconductor layer and a highly reflective electrode made of aluminum is insufficient. Therefore, a first electrode layer made of titanium (Ti) or another material is provided on the Group-III nitride compound semiconductor layer and a second electrode layer made of a material such as aluminum (Al) is provided on the first electrode layer. The first electrode layer has a thickness of less than 1 nm. In order to control the first electrode layer to be extremely thin, the first electrode layer is preferably formed at a rate of 0.2 nm/s (2 Å/s) or less in the thickness direction thereof.

Since the first electrode layer is very thin, the first electrode layer has no smooth surface but an irregular surface. The first electrode layer preferably has surface irregularities having a height equal to one half of the average thickness thereof to the average thickness thereof. This leads to an increase in the bonding strength between the first electrode layer and the Group-III nitride compound semiconductor layer and an increase in the contact area between the first and second electrode layers and allows the first electrode layer to have an extremely small thickness. When the first electrode layer has an extremely small thickness, the light absorption of the first electrode layer can be sufficiently suppressed and the bonding strength between the Group-III nitride compound semiconductor layer and the electrode including the first and second electrode layers can be maintained high. Therefore, the following device can be achieved: a Group-III nitride compound semiconductor light-emitting device which has high light extraction efficiency and which includes an electrode having high bonding strength.

The bonding strength of the first electrode layer, which has a thickness of less than 1 nm, is equal to about three fourths and is not less than one half of that of an electrode layer with a thickness of about 20 nm (200 Å). This causes no problem in practical use.

A method according to the present invention can be used to form an electrode on an n- or p-type Group-III nitride compound semiconductor layer. This electrode may be of a positive type.

DESCRIPTION OF THE PREFERRED EMBODIMENTS

Figure 1A:
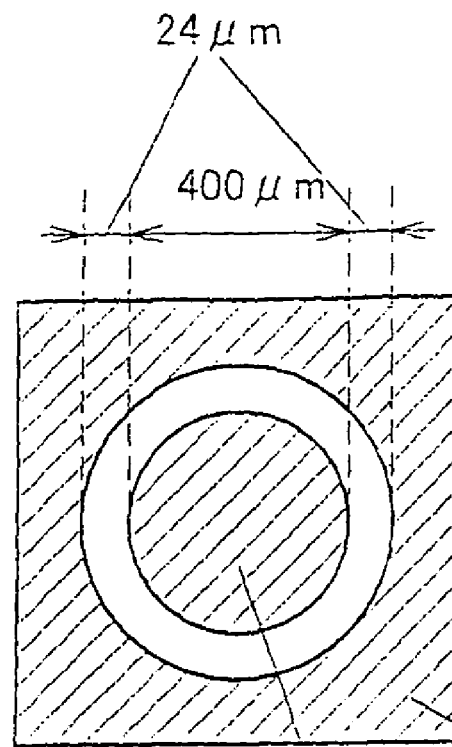
FIG. 1A is a plan view of a structure including a first electrode and second electrode used to measure contact resistance.

A first electrode layer and a second electrode layer can be formed by sputtering, vapor deposition, or another known process. The first electrode layer has an extremely small thickness. Therefore, it is necessary to control the average thickness of the first electrode layer.

The first electrode layer has surface irregularities. The surface irregularities preferably project from an imaginary plane of the first electrode layer at 5 Å or more. The first electrode layer preferably has an average thickness of not less than 0.3 nm (3 Å).

The second electrode layer preferably has a thickness of 0.03 to 5 µm. When the second electrode layer has a thickness of less than 0.03 µm, the reflectivity of the second electrode layer is insufficient. There is no advantage if the second electrode layer has a thickness of greater than 5 µm. If the second electrode layer needs to be formed from aluminum, which is inexpensive, so as to be thick, the second electrode layer may have a desired thickness. When the thickness of the second electrode layer is 0.1 to 2.5 µm, the second electrode layer has a sufficient reflectivity.

In view of device assembly and the like, another electrode layer may be deposited on the second electrode layer.

The first and second electrode layers are preferably formed in such a manner that, for example, a photoresist mask is formed so as to cover a region that is not used to form the first and second electrode layers and unnecessary portions are removed from the first and second electrode layers by lifting off the photoresist mask after the first and second electrode layers are formed. The first and second electrode layers are preferably thermally treated, or annealed. The thermal treatment temperature of the first and second electrode layers may be 100° C. to 650° C.

According to the present invention, a Group-III nitride compound semiconductor light-emitting device can be readily manufactured. Examples of the Group-III nitride compound semiconductor light-emitting device include light-emitting diode (LEDs), laser diodes (LDs), photocouplers, and other light-emitting devices. Any method can be used to manufacture the Group-III nitride compound semiconductor light-emitting device.

A substrate for crystal growth may be made of sapphire, spinel, Si, SiC, ZnO, MgO, or a single-crystalline Group-III nitride-based compound. The following technique is effective in forming a Group-III nitride compound semiconductor layer: molecular beam epitaxy (MBE), metal-organic vapor-phase epitaxy (MOVPE), halide vapor-phase epitaxy (HVPE), or the like.

In order to form an n-type Group-III nitride compound semiconductor layer negative, an n-type impurity such as Si, Ge, Se, Te, or C may be used. In order to form a p-type Group-III nitride compound semiconductor layer positive, a p-type impurity such as Zn, Mg, Be, Ca, Sr, or Ba may be used.

A light-emitting layer may have a single-layer structure, a single-quantum well (SQW) structure, a multi-quantum well (MQW) structure, or another structure.

The second electrode layer has high reflectivity and therefore is made of a material having high reflectivity for green light, blue light, and near-ultraviolet light. The second electrode layer is preferably made of a single metal such as aluminum, rhodium, platinum, or silver. Alternatively, the second electrode layer may be made of an alloy principally containing such a metal or may have a multilayer structure containing such a metal.

EXAMPLES

Advantages of the present invention will now be described with reference to experiments performed by the present inventors.

Example 1

Electrodes according to the present invention were measured for contact resistance with respect to n-type GaN as described below.

Figure 1B:
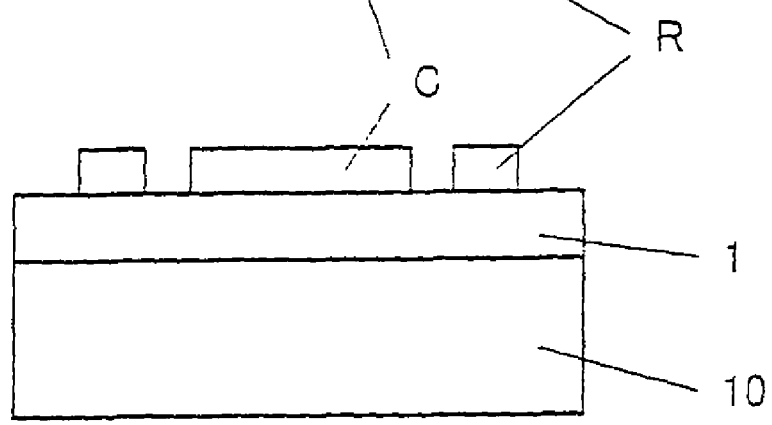
FIG. 1B is a sectional view of the structure shown in FIG. 1A.

FIG. 1A is a plan view of a structure including a first electrode C and second electrode R measured for contact resistance. FIG. 1B is a sectional view of the structure. As shown in FIG. 1B, a buffer layer (not shown) made of aluminum nitride (AlN) was formed on a sapphire substrate 10. A layer of GaN was formed on the buffer layer by MOVPE so as to have a thickness of about 4 μm and then doped with Si at a dose of 4×10¹⁸ cm⁻³, whereby an n-type GaN layer 1 was formed. The first and second electrodes C and R were formed on the n-type GaN layer 1 by vacuum vapor deposition. The first and second electrodes C and R may be formed by a sputtering process.

As shown in FIG. 1A, the first electrode C was disk-shaped and had a diameter of 400 μm. The second electrode R was spaced from the first electrode C at a distance of 24 μm and was ring-shaped.

The first and second electrodes C and R each included a titanium (Ti) layer with a thickness of 0.5 nm (5 Å) and an aluminum (Al) layer with a thickness of 2 μm (Example 1).

A comparative structure was prepared (Comparative Example 1). The comparative structure had substantially the same configuration as that of the structure of Example 1 except that the comparative structure included a third electrode and fourth electrode each including a vanadium (V) layer with a thickness of 17.5 nm (175 Å) and an aluminum (Al) layer with a thickness of 0.2 μm.

Figure 1C:
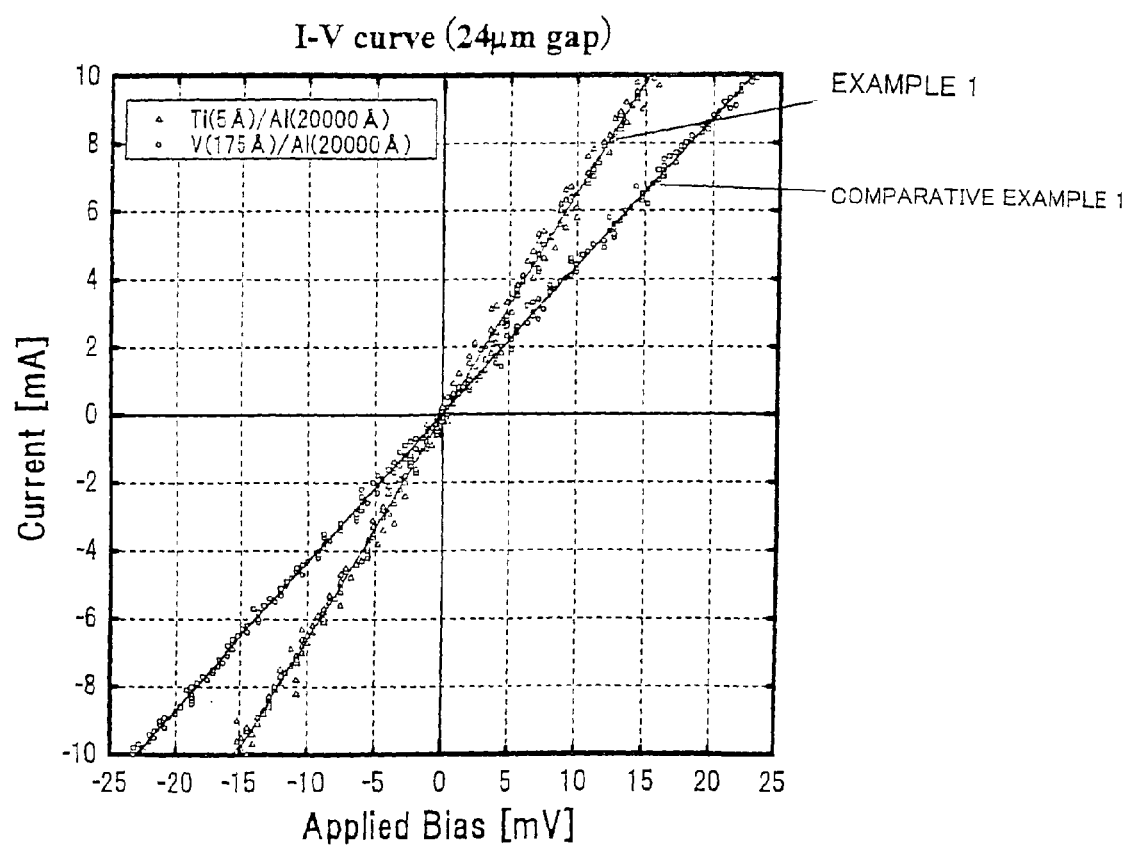
FIG. 1C is a graph showing the current-voltage curve of the structure shown in FIG. 1A and that of a comparative structure.

FIG. 1C is a graph showing the current-voltage curve of the structure thermally treated at 570° C. and that of the comparative structure thermally treated at 570° C. The current-voltage curves are linear. This shows that the ohmic electrodes suitable for n-type GaN can be obtained. The current flowing through the structure (represented by Δ) is greater than that flowing through the comparative structure (represented by ○) although the same voltage is applied to the structure and the comparative structure. This shows that the contact resistance of the first and second electrodes C and R with respect to the n-type GaN layer 1 is less than that of the third and fourth electrodes with respect to an n-type GaN layer included in the comparative structure.

The contact resistance of the first and second electrodes C and R with respect to the n-type GaN layer 1 was determined to be $1.9 \times 10^{-5}$ Ω/cm² by a TLM method in such a manner that the distance between the first and second electrodes C and R was varied. The contact resistance of the third and fourth electrodes with respect to the n-type GaN layer of the comparative structure was determined to be $6.5 \times 10^{-5}$ Ω/cm² in the same manner as described above. This shows that according to the present invention, an n-electrode having a contact resistance less than one third of that of a conventional n-electrode can be provided.

Example 2

An electrode according to the present invention was evaluated for reflectivity by a method below.

A first sample including a first sapphire substrate with a thickness of 400 μm and a first electrode disposed thereon was prepared in such a manner that a titanium (Ti) layer with a thickness of 0.5 nm (5 Å) and a first aluminum (Al) layer with a thickness of 2 μm were deposited on the first sapphire substrate in that order (Example 2).

A second sample, including a second sapphire substrate with a thickness of 400 μm and a second electrode disposed thereon, for comparison was prepared in such a manner that a first vanadium (V) layer with a thickness of 17.5 nm (175 Å) and a second aluminum (Al) layer with a thickness of 2 μm were deposited on the second sapphire substrate in that order (Comparative Example 2).

A third sample, including a third sapphire substrate and a third electrode disposed thereon, for comparison was prepared in such a manner that a third aluminum (Al) layer with a thickness of 2 μm was formed on the third sapphire substrate by vapor deposition.

The first, second, and third electrodes were measured for reflectivity in such a manner that light with a wavelength of 350 to 600 nm was applied to the first, second, and third sapphire substrates, respectively. The obtained measurements are not equal to the reflectivities of the first, second, and third electrodes in the strict sense but can be used to evaluate the first, second, and third electrodes for reflectivity because the reflectivity of the interface between air and each of the first, second, and third sapphire substrates is sufficiently small.

The first and second samples were measured for reflectivity before and after the first and second samples were annealed at 570° C. The evaluation results are summarized in FIG. 2A.

Figure 2A:
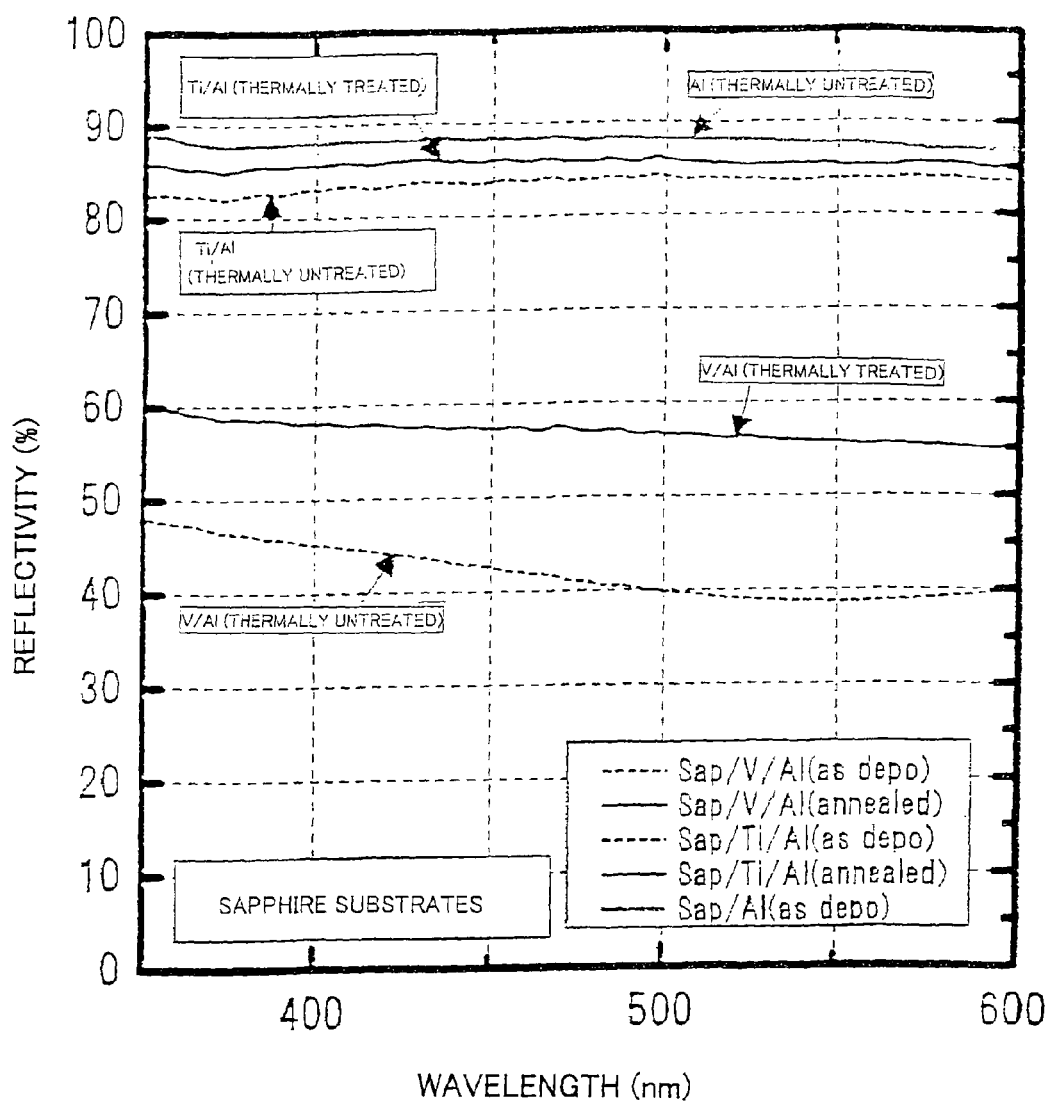
FIG. 2A is a graph showing the reflectivity of a first sample of Example 1, that of a second sample of Comparative Example 1, and that of a third sample for comparison.

The followings are clear from FIG. 2A.

The third sample has a reflectivity of 87% to 89% at a wavelength of 350 to 600 nm.

The thermally untreated first sample has a reflectivity of 82% to 84% at a wavelength of 350 to 600 nm. The thermally treated first sample has a reflectivity of 85% to 86% at a wavelength of 350 to 600 nm. That is, the reflectivity of the first sample was hardly reduced but was slightly increased by thermal treatment. This is probably because the titanium layer and the first aluminum layer were alloyed with each other by thermal treatment.

The thermally untreated second sample has a low reflectivity of 38% to 48% at a wavelength of 350 to 600 nm. The thermally treated second sample has a reflectivity of 55% to 60% at a wavelength of 350 to 600 nm. This is probably because the first vanadium layer and the second aluminum layer were alloyed with each other by thermal treatment and therefore the reflectivity of the second sample was increased. The reflectivity of the thermally treated second sample is far less than that of the thermally treated first sample.

As is clear from FIG. 2A, according to the present invention, the titanium layer, which is effective in bonding an n-type GaN layer and a highly reflective metal layer such as an aluminum layer together, has an extremely small thickness of less than 1 nm (1 Å) and therefore has low absorptance; hence, the first electrode, which is an n-electrode, has high reflectivity. Even if the titanium layer and the first aluminum layer are not thermally treated for alloying or are thermally treated at low temperature and therefore are not alloyed with each other, the first electrode has high reflectivity.

Figure 2B:
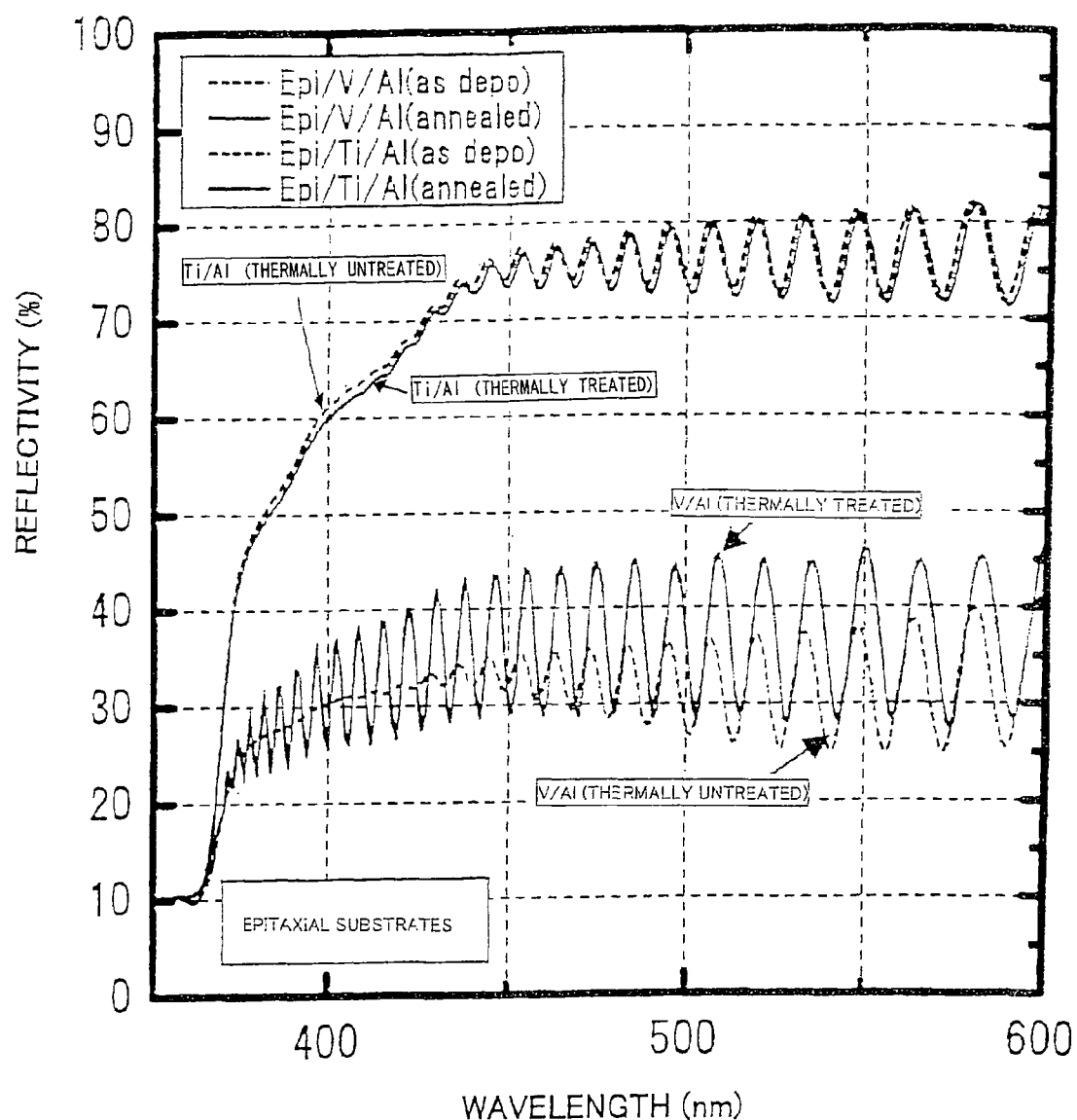
FIG. 2B is a graph showing the reflectivity of a fourth sample of Example 2 and that of a fifth sample of Comparative Example 2.

Structures were prepared in such a manner that the following layers were deposited on each epitaxial substrate by MOCVD (MOPVD) in this order: a buffer layer made of aluminum nitride (AlN), an n-type GaN layer 11 doped with Si, an n-type AlGaN clad layer 12 doped with Si, a light-emitting layer 13 having a GaN/InGaN multi-quantum well structure, a p-type AlGaN clad layer 14 doped with Mg, a p-type GaN layer 15 doped with Mg, and a p⁺-type GaN layer 16. The epitaxial substrate was substantially the same as the sapphire substrate 10 of the Group-III nitride compound semiconductor light-emitting device 900 shown in FIG. 8. A fourth sample (Example 2) was prepared in such a manner that a second titanium (Ti) layer with a thickness of 0.5 nm (5 Å) and a fourth aluminum (Al) layer with a thickness of 2 μm were deposited on the p⁺-type GaN layer 16 of one of the structures in that order such that a third electrode was formed on the p⁺-type GaN layer 16. A fifth sample (Comparative Example 2) was prepared in such a manner that a second vanadium (V) layer with a thickness of 17.5 nm (175 Å) and a fifth aluminum (Al) layer with a thickness of 2 μm were deposited on the p⁺-type GaN layer 16 of one of the structures in that order such that a fourth electrode was formed on the p+-type GaN layer 16. The third and fourth electrodes were measured for reflectivity in the same manner as that described above. The measurement results are shown in FIG. 2B. FIG. 2B illustrates that the reflectivity of each of the third and fourth electrodes varies depending on the wavelength of light because epitaxial layers absorb light with a wavelength of 400 nm or less and interference occurs depending on the thickness of the epitaxial layers and the wavelength of light.

The followings are clear from FIG. 2B.

The third electrode of the thermally treated fourth sample of Example 2 has a reflectivity of 50% or more at a wavelength of 380 nm or more and a reflectivity of 70% or more at a wavelength of 430 nm or more. The reflectivity of the third electrode slightly varies depending on the wavelength of light and is about 75% (71% to 82%).

The fourth electrode of the thermally treated fifth sample of Comparative Example 2 has a reflectivity of not greater than 46% at a wavelength of 380 to 600 nm. Significant interference is caused in the thermally treated fifth sample because of the thickness of the epitaxial layers. That is, the reflectivity of the third electrode of the thermally treated fourth sample is 1.8 to 2.4 times that of the fourth electrode of the thermally treated fifth sample. Therefore, according to the present invention, a highly reflective electrode can be obtained.

Example 3

Light-emitting devices were prepared and then evaluated as described below.

Figure 3:
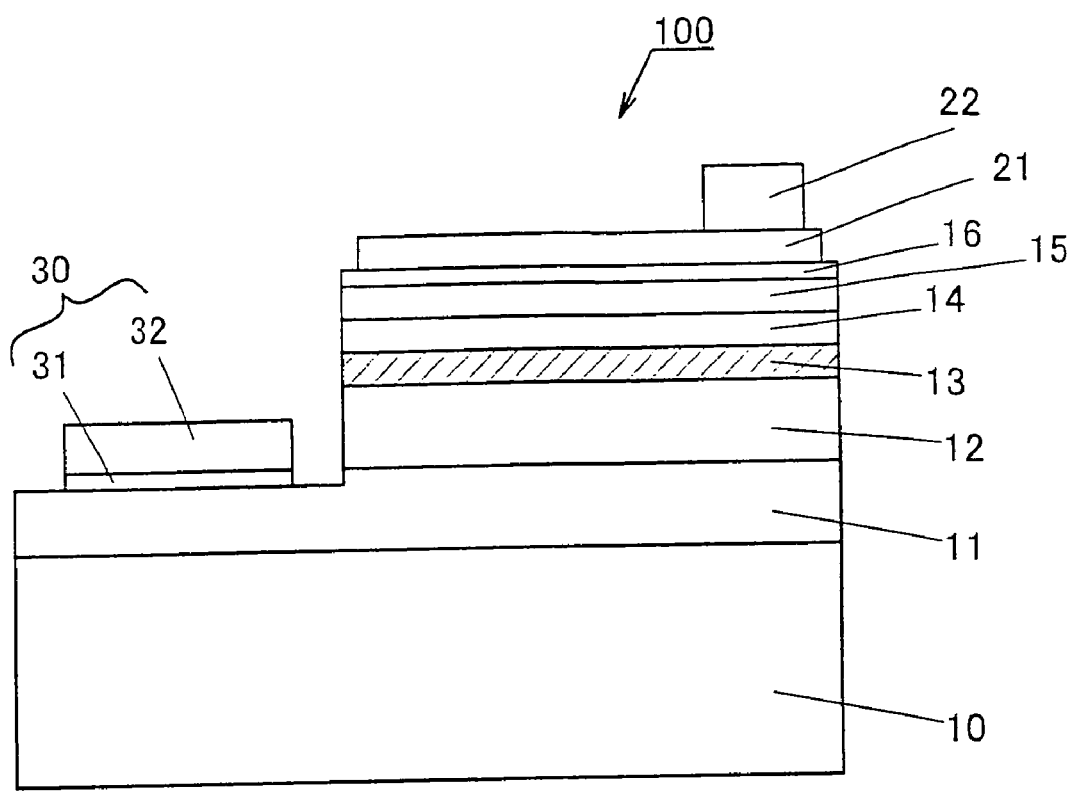
FIG. 3 is a sectional view of a Group-III nitride compound semiconductor light-emitting device according to an embodiment of the present invention.

FIG. 3 is a sectional view of a first Group-III nitride compound semiconductor light-emitting device 100 according to an embodiment of the present invention. The first Group-III nitride compound semiconductor light-emitting device 100 includes a sapphire substrate 10, a buffer layer (not shown) made of aluminum nitride (AlN), an n-type GaN layer 11 doped with Si, an n-type AlGaN clad layer 12 doped with Si, a light-emitting layer 13 having a GaN/InGaN multi-quantum well structure, a p-type AlGaN clad layer 14 doped with Mg, a p-type GaN layer 15 doped with Mg, and a p+-type GaN layer 16, these layers being deposited on the sapphire substrate 10 by MOCVD or MOPVD in that order.

The first Group-III nitride compound semiconductor light-emitting device 100 further includes a translucent electrode 21, made of ITO, extending over the p+-type GaN layer 16; a pad electrode 22, made of gold, lying on a portion of the translucent electrode 21; and an n-electrode 30 including a Ti layer 31 and an Al layer 32. The n-electrode 30 reflects light and light is extracted through the translucent electrode 21; hence, the first Group-III nitride compound semiconductor light-emitting device 100 is a face up-type light-emitting diode.

The first Group-III nitride compound semiconductor light-emitting device 100 was manufactured by a method below. Gaseous materials used were as follows: ammonia ($NH_3$), hydrogen ($H_2$) as a carrier gas, nitrogen ($N_2$) as a carrier gas, trimethyl gallium (TMG), trimethyl aluminum (TMA), trimethyl indium (TMI), silane ($SiH_4$), and bis(cyclopentadienyl) magnesium ($Cp_2Mg$).

The sapphire substrate 10 was single-crystalline and had a principal surface organically and thermally cleaned. The sapphire substrate 10 was attached to a susceptor placed in a reaction chamber of a MOCVD system. The sapphire substrate 10 was baked at 1,100° C. for about 30 minutes while the reaction chamber was being supplied with $H_2$ at a flow rate of 2 L/min at normal pressure.

After the temperature of the sapphire substrate 10 was reduced to 400° C., the reaction chamber was supplied with $H_2$, $NH_3$, and TMA for about one minute at a $H_2$ flow rate of 20 L/min, an $NH_3$ flow rate of 10 L/min, and a TMA flow rate of $1.8 \times 10^{-5}$ mol/min, whereby the buffer layer was formed on the principal surface of the sapphire substrate 10 so as to have a thickness of about 25 nm.

After the temperature of the sapphire substrate 10 was increased to 1,150° C., the reaction chamber was supplied with $H_2$, $NH_3$, TMG, and a $SiH_4$—$H_2$ gas mixture having a $SiH_4$ content of 0.86 ppm for about 40 minutes at a $H_2$ flow rate of 20 L/min, an $NH_3$ flow rate of 10 L/min, a TMG flow rate of $1.78 \times 10^{-4}$ mol/min, and a $SiH_4$ flow rate of $20 \times 10^{-8}$ mol/min, respectively, whereby the n-type GaN layer 11 was formed on the buffer layer so as to have a thickness of about 4.0 μm, an electron concentration of $2 \times 10^{18}$ cm$^{-3}$, and a silicon concentration of $4 \times 10^{18}$ cm$^{-3}$.

The reaction chamber was supplied with $NH_3$, TMG, TMA, a $SiH_4$—$H_2$ gas mixture having a $SiH_4$ content of 0.86 ppm, and $N_2$ or $H_2$ for about 60 minutes at an $NH_3$ flow rate of 10 L/min, a TMG flow rate of $1.12 \times 10^{-4}$ mol/min, a TMA flow rate of $0.47 \times 10^{-4}$ mol/min, a $SiH_4$ flow rate of $5 \times 10^{-9}$ mol/min, and a $N_2$ or $H_2$ flow rate of 10 L/min, respectively, while the sapphire substrate 10 was maintained at 1,150° C., whereby the n-type AlGaN clad layer 12 was formed on the n-type GaN layer 11 so as to have a thickness of about 0.5 μm, an electron concentration of $1 \times 10^{18}$ cm$^{-3}$, and a silicon concentration of $2 \times 10^{18}$ cm$^{-3}$. The n-type AlGaN clad layer 12 had the formula $Al_{0.08}Ga_{0.92}N$.

After the n-type AlGaN clad layer 12 was formed, the reaction chamber was supplied with $NH_3$, TMG, and $N_2$ or $H_2$ for about one minute at an $NH_3$ flow rate of 10 L/min, a TMG flow rate of $2.0 \times 10^{-4}$ mol/min, and a $N_2$ or $H_2$ flow rate of 20 L/min, respectively, whereby a GaN barrier sublayer having a thickness of about 35 Å was formed on the n-type AlGaN clad layer 12. The reaction chamber was supplied with $NH_3$, TMG, TMI, and $N_2$ or $H_2$ for about one minute at an $NH_3$ flow rate of 10 L/min, a TMG flow rate of $7.2 \times 10^{-5}$ mol/min, a TMI flow rate of $0.19 \times 10^{-4}$ mol/min, and a $N_2$ or $H_2$ flow rate of 20 L/min, respectively, whereby a well sublayer which had a thickness of about 35 Å and which had the formula $In_{0.20}Ga_{0.80}N$ was formed on the GaN barrier sublayer. This procedure was repeated five times. Another GaN barrier sublayer was formed on the uppermost well sublayer under the same conditions as described above, whereby the light-emitting layer 13 was formed. The light-emitting layer 13 had a five-period multi-quantum well structure.

The reaction chamber was supplied with $NH_3$, TMG, TMA, $Cp_2Mg$, and $N_2$ or $H_2$ for about three minutes at an $NH_3$ flow rate of 10 L/min, a TMG flow rate of $1.0 \times 10^{-4}$ mol/min, a TMA flow rate of $1.0 \times 10^{-4}$ mol/min, a $Cp_2Mg$ flow rate of $2 \times 10^{-5}$ mol/min, and a $N_2$ or $H_2$ flow rate of 10 L/min, respectively, while the sapphire substrate 10 was maintained at 1,100° C., whereby the p-type AlGaN clad layer 14 doped with Mg was formed on the light-emitting layer 13. The p-type AlGaN clad layer 14 had a thickness of about 50 nm, a magnesium concentration of $5 \times 10^{19}$ cm$^{-3}$, and the formula $Al_{0.15}Ga_{0.85}N$.

The reaction chamber was supplied with $NH_3$, TMG, $Cp_2Mg$, and $N_2$ or $H_2$ for about 30 seconds at an $NH_3$ flow rate of 10 L/min, a TMG flow rate of $1.12 \times 10^{-4}$ mol/min, a $Cp_2Mg$ flow rate of $2 \times 10^{-5}$ mol/min, and a $N_2$ or $H_2$ flow rate of 20 L/min, respectively, while the sapphire substrate 10 was maintained at 1,100° C., whereby the p-type GaN layer 15 doped with Mg was formed on the p-type AlGaN clad layer 14. The p-type GaN layer 15 had a thickness of about 100 nm and a magnesium concentration of $5 \times 10^{19}$ cm$^{-3}$. The p+-type GaN layer 16 doped with magnesium was formed on the p-type GaN layer 15 so as to have a thickness of about 10 nm and a magnesium concentration of $1\times10^{20}$ cm$^{-3}$.

A photoresist etching mask was provided on the p$^+$-type GaN layer 16 and predetermined regions were then removed from the photoresist etching mask. The following portion and layers were partly removed by reactive ion etching using a reactive gas containing chlorine: a portion of the p$^+$-type GaN layer 16 that was uncovered from the photoresist etching mask, the p-type GaN layer 15, the p-type AlGaN clad layer 14, the light-emitting layer 13, the n-type AlGaN clad layer 12, and the n-type GaN layer 11. This allowed the n-type GaN layer 11 to be exposed. An ITO layer was formed on the p$^+$-type GaN layer 16 by vacuum vapor deposition so as to have a thickness of 300 nm and then thermally treated at 700° C. in a nitrogen atmosphere. An unnecessary portion was removed from the ITO layer by wet etching using a photoresist mask, whereby the translucent electrode 21 was formed.

A photoresist mask having windows corresponding to necessary portions was formed over the n-type GaN layer 11 and the translucent electrode 21. Electrode materials were provided over this photoresist mask, which was then lifted off. Unnecessary portions were removed from the electrode materials, whereby electrodes below were formed.

In particular, the pad electrode 22 was formed on the translucent electrode 21 using gold. The Ti layer 31, or a first electrode layer, was formed on the n-type GaN layer 11 at a rate of 6.0 nm/min (60 Å/min) by vacuum vapor deposition so as to have a thickness of 0.5 nm (5 Å). The Al layer 32, or a second electrode layer, was then formed on the Ti layer 31, whereby the n-electrode 30 was formed. The n-electrode 30 was thermally treated at 570° C. for five minutes, whereby the Ti layer 31 and the Al layer 32 were alloyed with each other.

Figure 8:
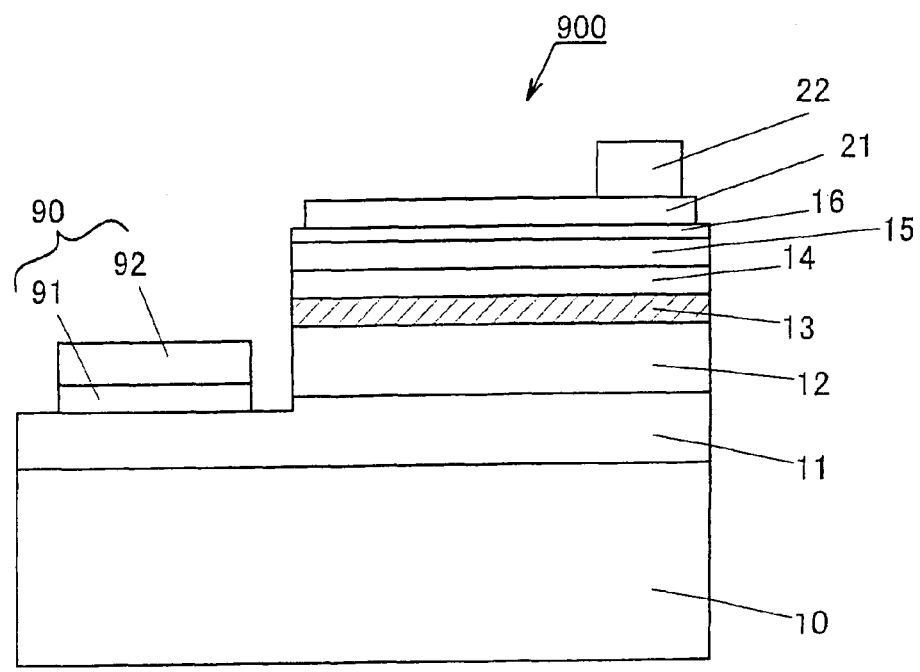
FIG. 8 is a sectional view of a conventional Group-III nitride compound semiconductor light-emitting device.

A second Group-III nitride compound semiconductor light-emitting device 900 for comparison was prepared as shown in FIG. 8 (Comparative Example 2). The second Group-III nitride compound semiconductor light-emitting device 900 had substantially the same configuration as that of the first Group-III nitride compound semiconductor light-emitting device 100 except that the second Group-III nitride compound semiconductor light-emitting device 900 included a vanadium (V) layer 91 with a thickness of 17.5 nm (175 Å) instead of the Ti layer 31. The first and second Group-III nitride compound semiconductor light-emitting devices 100 and 900 had a size of 240 μm×480 μm in plan view. The n-electrodes 30 had an area, in plan view, equal to about 10% of that of the first and second Group-III nitride compound semiconductor light-emitting devices 100 and 900.

Comparisons between properties of the first and second Group-III nitride compound semiconductor light-emitting devices 100 and 900 were as described below.

The radiant flux of the first Group-III nitride compound semiconductor light-emitting device 100 was 1.07 times that of the second Group-III nitride compound semiconductor light-emitting device 900, that is, the light extraction efficiency of the first Group-III nitride compound semiconductor light-emitting device 100 was seven percent higher than that of the second Group-III nitride compound semiconductor light-emitting device 900.

The driving voltage of the first Group-III nitride compound semiconductor light-emitting device 100 was less than or equal to that of the second Group-III nitride compound semiconductor light-emitting device 900 when the first and second Group-III nitride compound semiconductor light-emitting devices 100 and 900 were supplied with a current of 20 mA.

The first and second Group-III nitride compound semiconductor light-emitting devices 100 and 900 were subjected to a peel test (a shear strength test) in such a manner that wires were bonded to the n-electrodes 30 and 90 and the shear rate was 200 μm/s. The shear strength of the first Group-III nitride compound semiconductor light-emitting device 100 was 0.76 times that of the second Group-III nitride compound semiconductor light-emitting device 900, that is, the shear strength of the first Group-III nitride compound semiconductor light-emitting device 100 was slightly less than that of the second Group-III nitride compound semiconductor light-emitting device 900. However, the shear strength of the first Group-III nitride compound semiconductor light-emitting device 100 was greater than 0.4 times that of the second Group-III nitride compound semiconductor light-emitting device 900; hence, the first Group-III nitride compound semiconductor light-emitting device 100 was sufficient for practical use.

Example 4

In order to investigate the reason why the strength was not reduced in the peel test described in Example 3, thin titanium layers were analyzed for thickness distribution by atomic force microscopy (AFM) as described below. A 16 Å thick titanium layer was formed on a first sapphire substrate in such a manner that titanium was deposited on the first sapphire substrate for 40 seconds at a rate of 2.4 nm/min (24 Å/min). An 8 Å thick titanium layer was formed on a second sapphire substrate in such a manner that titanium was deposited on the second sapphire substrate for 20 seconds at a rate of 2.4 nm/min (24 Å/min). The 16 Å and 8 Å thick titanium layers were analyzed for thickness distribution by AFM. The analysis results are summarized in FIG. 4. The AMF profile of the 16 Å thick titanium layer is significantly different from that of the 8 Å thick titanium layer.

Figure 4:
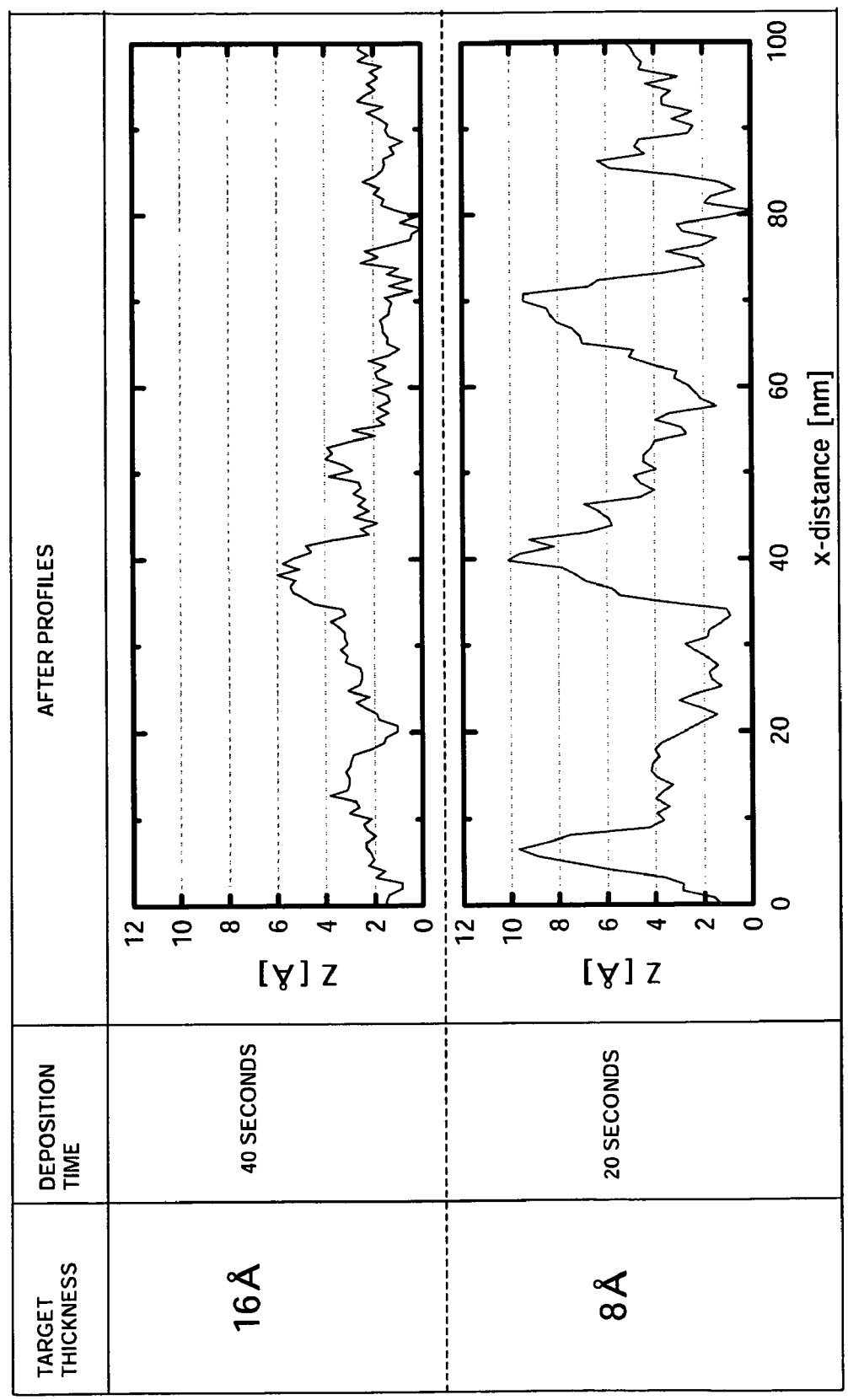
FIG. 4 is an illustration showing the AMF profile of a 16 Å thick titanium layer and that of an 8 Å thick titanium layer.

With reference to FIG. 4, the 16 Å thick titanium layer has a smooth surface, that is, the 16 Å thick titanium layer has small surface irregularities. In the AFM profile of the 16 Å thick titanium layer, the vertical distance between the top of the highest peak and the bottom (located at a 0 Å position in FIG. 4) of the deepest valley is 6 Å. Suppose that the height of an imaginary plane for defining the average thickness of the 16 Å thick titanium layer from the bottom of the deepest valley is about 2.5 Å, the top of the highest peak is only about 3.5 Å higher than the imaginary plane. The AFM profile of the 16 Å thick titanium layer has only three peaks that are higher than the imaginary plane. The other peaks are lower than the imaginary plane.

In contrast, the 8 Å thick titanium layer has a rough surface, that is, the 8 Å thick titanium layer has large surface irregularities. In the AFM profile of the 8 Å thick titanium layer, the vertical distance between the top of the highest peak and the bottom (located at a 0 Å position in FIG. 4) of the deepest valley is 10 Å. Suppose that the height of an imaginary plane for defining the average thickness of the 8 Å thick titanium layer from the bottom of the deepest valley is about 4 Å, the tops of three peaks are about 6 Å higher than the imaginary plane. The AFM profile of the 8 Å thick titanium layer has five peaks that are higher than the imaginary plane. Other peaks are also high.

As shown in FIG. 4, the AFM profile of the 16 Å thick titanium layer, which is thicker than 1 nm (10 Å), is significantly different from that of the 8 Å thick titanium layer, which is thinner than 1 nm (10 Å). The surface irregularities of the 8 Å thick titanium layer are large as described above. Therefore, the 8 Å thick titanium layer has a large contact area with an upper layer disposed thereon and the anchoring effect due to the surface irregularities probably enhances the adhesion between the 8 Å thick titanium layer and the upper layer.

The ratio of the surface area to the volume of the 8 Å thick titanium layer, which is extremely thin, is large; hence, the strain on the 8 Å thick titanium layer can be readily reduced because of the diffusion of atoms present at the surface of the 8 Å thick titanium layer. A layer of a material such as tungsten has a large intrinsic strain (or stress) and therefore it is difficult to bond the material layer to another layer when the material layer has a large thickness. However, if the material layer is formed by a method according to the present invention so as to have an extremely small thickness, the material layer probably has a small intrinsic strain and therefore has sufficient adhesion to another layer. Even the following material can be used to form a first electrode layer if the first electrode layer is formed by the method according to the present invention so as to have an extremely small thickness: a material which has low contact resistance with a Group-III nitride compound semiconductor layer and of which a layer has low adhesion to another layer if the layer is formed by a conventional method. These advantages probably allow the first electrode layer, which has an extremely small thickness, to have sufficient bonding strength.

Example 5

Figure 5:
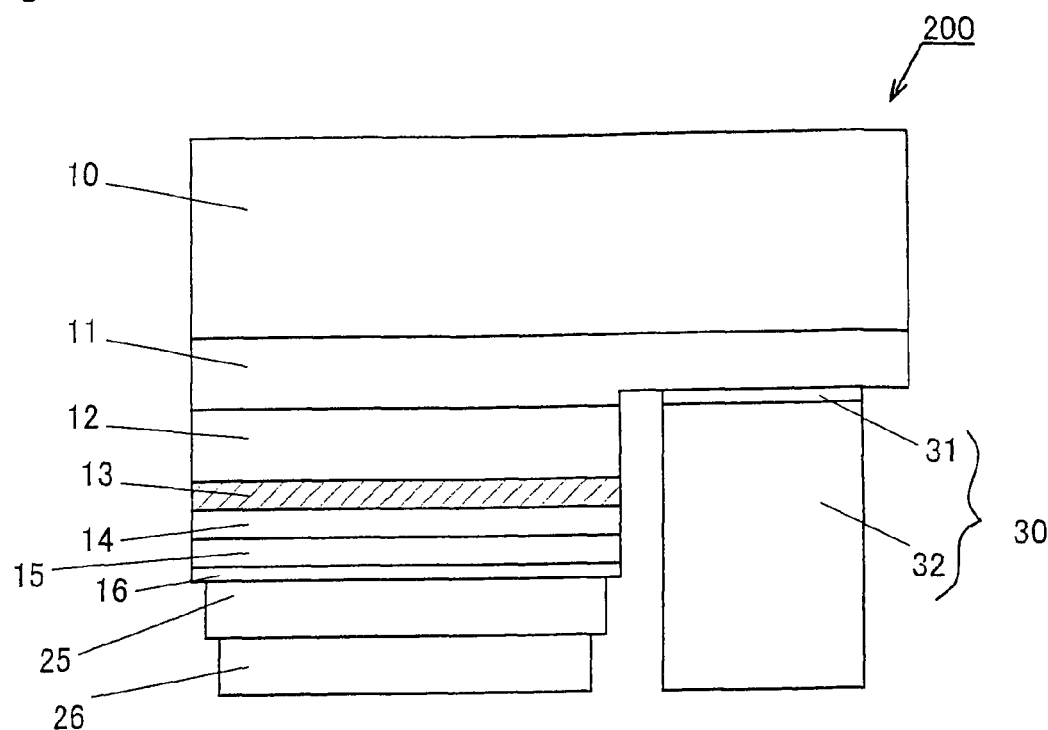
FIG. 5 is a sectional view of a Group-III nitride compound semiconductor light-emitting device according to another embodiment of the present invention.

FIG. 5 is sectional view of a Group-III nitride compound semiconductor light-emitting device 200 according to an embodiment of the present invention. The Group-III nitride compound semiconductor light-emitting device 200 is different from the first Group-III nitride compound semiconductor light-emitting device 100, manufactured in Example 3, shown in FIG. 3 in that a highly reflective electrode 25 made of rhodium (Rh) and a pad electrode 26 are arranged on a $p^+$-type GaN layer 16 in that order and the thickness of the highly reflective electrode 25 and that of the pad electrode 26 are adjusted such that the top of the pad electrode 26 is substantially flush with the top (a lower position in FIG. 5) of a second electrode layer 32 which is made of aluminum (Al) and which is an n-electrode. Other components of the Group-III nitride compound semiconductor light-emitting device 200 can be readily formed by a known technique similar to the method for manufacturing the first Group-III nitride compound semiconductor light-emitting device 100. The Group-III nitride compound semiconductor light-emitting device 200 is a flip chip-type light-emitting diode in which an n-electrode and a p-electrode have high reflectivity and light is extracted through the rear surface of a sapphire substrate 10 (in the upper direction in FIG. 5). The use of the n-electrode according to the present invention leads to an increase in light extraction efficiency.

Example 6

Figure 6:
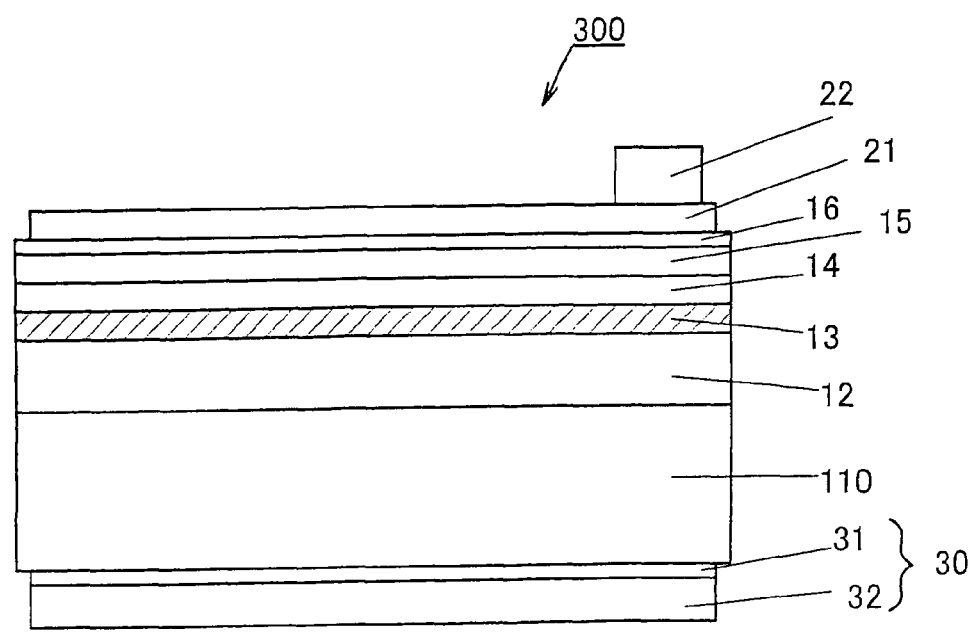
FIG. 6 is a sectional view of a Group-III nitride compound semiconductor light-emitting device according to another embodiment of the present invention.

FIG. 6 is sectional view of a Group-III nitride compound semiconductor light-emitting device 300 according to an embodiment of the present invention. The Group-III nitride compound semiconductor light-emitting device 300 is different from the first Group-III nitride compound semiconductor light-emitting device 100, manufactured in Example 3, shown in FIG. 3 in that a conductive n-type GaN substrate 110 is used and an n-electrode is disposed on the rear surface of the conductive n-type GaN substrate 110. Other components of the Group-III nitride compound semiconductor light-emitting device 300 can be readily formed by a known technique similar to the method for manufacturing the first Group-III nitride compound semiconductor light-emitting device 100. The Group-III nitride compound semiconductor light-emitting device 300 is a face up-type vertical light-emitting diode including a p-type electrode located at an upper position and an n-type electrode located at a lower position. The n-type electrode has high resistivity. The use of the n-type electrode leads to an increase in light extraction efficiency. In a flip chip-type light-emitting diode that includes a conductive n-type GaN substrate 110, a p-type electrode which is made of rhodium (Rh) and which has high reflectivity, and an n-type pad electrode, disposed on a principal surface of the conductive n-type GaN substrate 110, for wire bonding, the use of an n-type electrode which is formed by a method according to the present invention so as to have high reflectivity leads to an increase in light extraction efficiency.

Example 7

Figure 7:
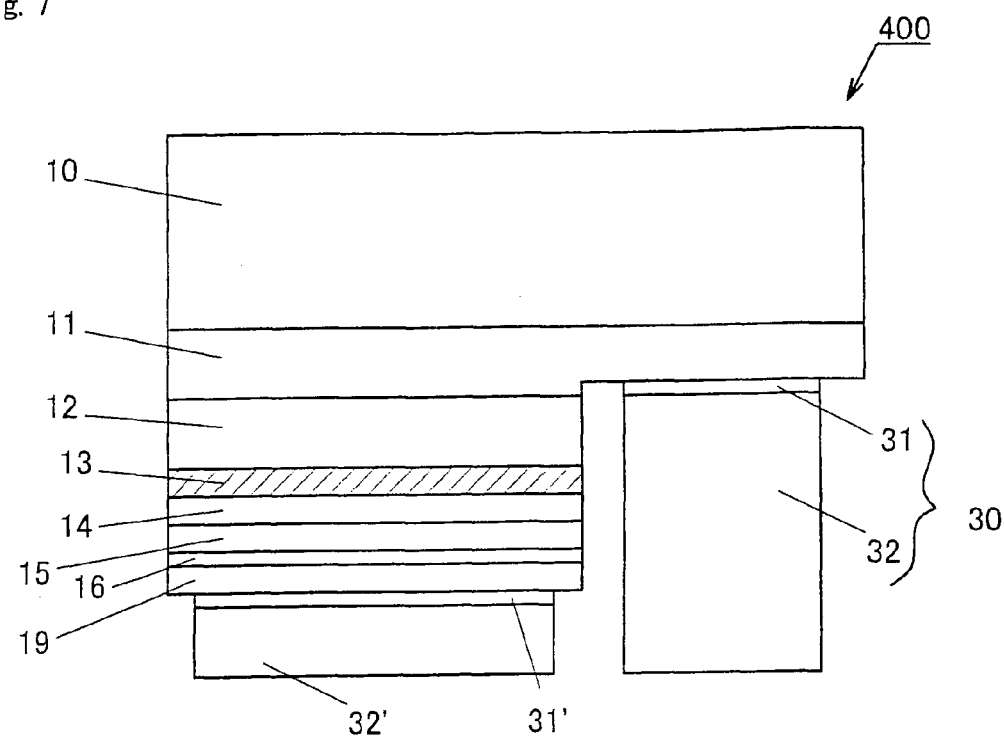
FIG. 7 is a sectional view of a Group-III nitride compound semiconductor light-emitting device according to another embodiment of the present invention.

FIG. 7 is sectional view of a Group-III nitride compound semiconductor light-emitting device 400 according to an embodiment of the present invention. The Group-III nitride compound semiconductor light-emitting device 400 is different from the first Group-III nitride compound semiconductor light-emitting device 100, manufactured in Example 3, shown in FIG. 3 in that an $n^+$-type GaN layer 19 with a high donor concentration is provided on a $p^+$-type GaN layer 16 and a first electrode layer 31' and a second electrode layer 32' are formed on the $n^+$-type GaN layer 19 in that order by a method according to the present invention. The first and second electrode layers 31' and 32' cooperatively function as a positive electrode for the Group-III nitride compound semiconductor light-emitting device 400. Electrons can be injected into the interface between the $n^+$-type GaN layer 19 and the $p^+$-type GaN layer 16 by tunnel transport. Other components of the Group-III nitride compound semiconductor light-emitting device 400 can be readily formed by a known technique similar to the method for manufacturing the first Group-III nitride compound semiconductor light-emitting device 100. The Group-III nitride compound semiconductor light-emitting device 400 is a flip chip-type light-emitting diode in which a positive electrode and a negative electrode are formed by a method according to the present invention so as to have high reflectivity and light is extracted through the rear surface of a sapphire substrate 10 (in the upper direction in FIG. 5). The use of an n-electrode according to the present invention for the positive and negative electrodes leads to an increase in light extraction efficiency. Since the positive and negative electrodes can be simultaneously formed, the Group-III nitride compound semiconductor light-emitting device 400 can be manufactured by a simple process at low cost.

In Example 3, the light-emitting layer 13 of the first Group-III nitride compound semiconductor light-emitting device 100 has such a multi-quantum well structure and may have a single-quantum well structure or an $In_{0.2}Ga_{0.8}N$ single-layer structure or may contain a ternary or quaternary eutectic such as AlInGaN. Mg is used as a p-type impurity and a Group-II (Group-IIa or -IIb) element such as beryllium (Be) or zinc (Zn) may be used instead of Mg.

In Example 3, the Ti layer 31, which serves as a first electrode layer and has a thickness of less than 1 nm, is disposed on the n-type GaN layer 11. A first electrode layer, made of the following material, having a thickness of less than 1 nm may be disposed on a Group-III nitride compound semiconductor layer having an arbitrary composition: a metal such as titanium (Ti), vanadium (V), chromium (Cr), nickel (Ni), indium (In), cobalt (Co), copper (Cu), tungsten (W), tantalum (Ta), niobium (Nb), tin (Sn), hafnium (Hf), zirconium (Zr), manganese (Mn), or magnesium (Mg); an alloy containing the metal; a nitride of the metal; or a carbide of the metal. A first electrode layer disposed on an n-type Group-III nitride compound semiconductor layer is preferably made of titanium (Ti) or titanium nitride (TiN). A first electrode layer disposed on a p-type Group-III nitride compound semiconductor layer is preferably made of nickel (Ni). A second electrode layer is preferably made of rhodium (Rh)

In Example 3, the Al layer 32, which serves as a second electrode layer, is disposed on the Ti layer 31. A layer of a highly reflective material may be used instead of the Al layer 32. The highly reflective material layer is preferably made of a single metal such as silver (Ag) or platinum (Pt), or rhodium (Rh) or an alloy containing such a metal and may have a multilayer structure. The highly reflective material layer may have a small thickness of 30 nm or less or a large thickness of 5 µm or more. This case is within the scope of the present invention.

What is claimed is:

1. A method for forming an electrode for Group-III nitride compound semiconductor light-emitting devices, said method comprising:
   forming a first electrode layer having an average thickness of 0.3 to 1 nm and surface irregularities having a height from one half of the average thickness thereof to the average thickness thereof on an n-type GaN semiconductor layer, the first electrode layer comprising a material which is at least one selected from a group consisting of titanium and titanium nitride; and
   forming a second electrode layer comprising a reflective metal material on the first electrode layer, the reflective metal material comprising aluminum, and the second electrode layer having a thickness of 0.03 to 5 µm.

2. The method according to claim 1, wherein the first electrode layer is formed at a rate of 0.2 nm/s or less.

3. The method according to claim 2, further comprising:
   thermally treating the first electrode layer and the second electrode layer.

4. The method according to claim 1, further comprising:
   thermally treating the first electrode layer and the second electrode layer.

5. The method according to claim 1, wherein the n-type GaN semiconductor layer is formed on a p-type GaN semiconductor layer.

6. The method according to claim 5, further comprising:
   thermally treating the first electrode layer and the second electrode layer.

7. The method according to claim 1, further comprising:
   forming a p-type GaN semiconductor layer;
   forming a second n-type GaN semiconductor layer on the p-type GaN semiconductor layer;
   forming a third electrode layer having an average thickness of 0.3 to 1 nm and surface irregularities having a height from one half of the average thickness thereof to the average thickness thereof on the second n-type GaN semiconductor layer, the third electrode layer comprising a material which is at least one selected from the group consisting of titanium and titanium nitride; and
   forming a fourth electrode layer comprising a reflective metal material on the third electrode layer, the reflective metal material comprising aluminum, and the fourth electrode layer having a thickness of 0.03 to 5 µm.

8. The method according to claim 7, further comprising:
   thermally treating the first electrode layer, the second electrode layer, the third electrode layer, and the fourth electrode layer.

* * * * *

UNITED STATES PATENT AND TRADEMARK OFFICE
CERTIFICATE OF CORRECTION

PATENT NO. : 7,947,521 B2  
APPLICATION NO. : 12/078066  
DATED : May 24, 2011  
INVENTOR(S) : Koichi Goshonoo and Miki Moriyama Page 1 of 1

It is certified that error appears in the above-identified patent and that said Letters Patent is hereby corrected as shown below:

Title Page, should read;

Please correct Assignee:

(73) TOYO<u>D</u>A GOSEI CO., LTD.

Signed and Sealed this  
Nineteenth Day of July, 2011

David J. Kappos  
*Director of the United States Patent and Trademark Office*